(12) United States Patent
Weeth et al.

(10) Patent No.: US 11,129,289 B2
(45) Date of Patent: Sep. 21, 2021

(54) BEARING ASSEMBLY WITH INCORPORATED ELECTRIC LINE FOR PROVIDING MULTIPLE OPERATING VOLTAGES

(71) Applicant: SCHAEFFLER TECHNOLOGIES AG & CO. KG, Herzogenaurach (DE)

(72) Inventors: Christoph Weeth, Bergrheinfeld (DE); Jens Heim, Bergrheinfeld (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 759 days.

(21) Appl. No.: 15/769,203

(22) PCT Filed: Sep. 28, 2016

(86) PCT No.: PCT/DE2016/200454
§ 371 (c)(1),
(2) Date: Apr. 18, 2018

(87) PCT Pub. No.: WO2017/071702
PCT Pub. Date: May 4, 2017

(65) Prior Publication Data
US 2018/0320736 A1    Nov. 8, 2018

(30) Foreign Application Priority Data
Oct. 27, 2015   (DE) .................. 102015220921.0

(51) Int. Cl.
| | |
|---|---|
| *H05K 7/02* | (2006.01) |
| *F16C 41/00* | (2006.01) |
| *G01P 3/44* | (2006.01) |
| *F16C 19/22* | (2006.01) |
| *G01D 11/02* | (2006.01) |

(52) U.S. Cl.
CPC ............. *H05K 7/02* (2013.01); *F16C 19/22* (2013.01); *F16C 41/00* (2013.01); *F16C 41/002* (2013.01); *G01P 3/443* (2013.01); *G01D 11/02* (2013.01)

(58) Field of Classification Search
CPC .......... F16C 19/22; F16C 19/52; F16C 41/00; F16C 41/002; G01P 3/443; G01D 11/02; G01D 11/245; H05K 7/02; G01L 5/0009
USPC ...... 384/448; 73/862.041–862.046, 863.322, 73/862.325, 862.473, 862.628
See application file for complete search history.

(56) References Cited

U.S. PATENT DOCUMENTS 8,596,146 B2    12/2013   Ono et al.

FOREIGN PATENT DOCUMENTS

| CN | 1751187 A | 3/2006 | |
|---|---|---|---|
| CN | 100434920 C * | 11/2008 | ............. G01P 3/487 |

(Continued)

OTHER PUBLICATIONS

International Search Report for Application No. PCT/DE2016/200454, dated Dec. 12, 2016, 6 pages.

*Primary Examiner* — Marcus Charles
(74) *Attorney, Agent, or Firm* — Dickinson Wright PLLC

(57) ABSTRACT

A bearing assembly, comprising a bearing configured to support a machine part, an installation space configured to receive at least one electronic module, a mount in the installation space that includes an electric line and the electronic module is attached to the mount, one or more continuous electronic conductor paths, and one or more interrupted conductor path that is parallel to the continuous electronic conduct path.

20 Claims, 1 Drawing Sheet

(56) References Cited

FOREIGN PATENT DOCUMENTS

| | | | | |
|---|---|---|---|---|
| CN | 101926236 | A | 12/2010 | |
| CN | 204486464 | U * | 7/2015 | |
| DE | 2703473 | A1 | 8/1977 | |
| DE | 112009002662 | T5 | 6/2012 | |
| DE | 102015202129 | A1 * | 8/2016 | ........... G01D 11/245 |
| EP | 0432122 | A2 | 6/1991 | |
| EP | 1717464 | A2 | 11/2006 | |
| EP | 1933155 | A1 | 6/2008 | |
| EP | 2508859 | A1 | 10/2012 | |
| EP | 2683758 | A1 | 1/2014 | |
| EP | 2440943 | B1 * | 8/2015 | ................ B66F 9/08 |
| JP | 2002274208 | A * | 9/2002 | .......... B60K 17/344 |
| JP | 2004251316 | A | 9/2004 | |
| JP | 2007506985 | A * | 3/2007 | .............. F16C 19/52 |
| JP | 2009025009 | A | 2/2009 | |
| JP | 2010035347 | A * | 2/2010 | ............ H05K 7/209 |
| WO | 2007098943 | A1 | 9/2007 | |
| WO | 2007104894 | A1 | 9/2007 | |
| WO | 2010070392 | A1 | 6/2010 | |
| WO | 2010143022 | A1 | 12/2010 | |
| WO | 2012080780 | A1 | 12/2010 | |
| WO | 2013005068 | A1 | 7/2011 | |
| WO | WO-2013098584 | A1 * | 7/2013 | ............ F16C 41/007 |

* cited by examiner

BEARING ASSEMBLY WITH INCORPORATED ELECTRIC LINE FOR PROVIDING MULTIPLE OPERATING VOLTAGES

CROSS-REFERENCE TO RELATED APPLICATIONS

This application is the U.S. National Phase of PCT/DE2016/200454 filed Sep. 28, 2016, which claims priority to DE 102015220921.0 filed Oct. 27, 2015, the entire disclosures of which are incorporated by reference herein.

TECHNICAL FIELD

The present disclosure relates to a bearing assembly that has a bearing for supporting a machine part, an installation space inside the bearing assembly for receiving one or more electronic modules, and a mount extending into the installation space that has conductor paths that serve for the power supply or coupling of these electric modules. The installation space may be located in the bearing, although it can also be located on the outer surface of the bearing.

BACKGROUND

By way of example, the bearing can be a roller bearing, which comprises two components that rotate in relation to one another, i.e. an inner and outer ring, as well as numerous rolling elements. By way of example, measurement data recording systems in the form of electronic modules are integrated in such bearings for measuring loads. The electronic modules can comprise sensors, data processing units, and interfaces for outputting data, for example. Power supply units can likewise be integrated in the electronic modules.

Assemblies of electronic modules for angle measurements in bearing series are depicted in WO 2013/005068 A1, WO 2007/104894 A1, and EP 2 682 758 A1. In WO 2007/104894 A1 it is furthermore explained that an electronic circuit board is attached to a flange.

A roller bearing in which the distance of the electronic module to the rotating part of the bearing can be adjusted is described in WO 2010/070392 A1, as well as the production process for the roller bearing with electronic modules.

An attachment of the electronics to the outer ring of a bearing through a pressure bonding of the rods to the outer ring and supplementary laser or electron radiation welding is explained in JP 2004/251316 A.

WO 2010/143022 discloses a roller bearing assembly with electronic modules for measuring rotation parameters. A similar assembly is shown in WO 2012/080780.

A roller bearing that has a device for determining rotation parameters and a flexible, folding, non-rotating electronic circuit board with electronic modules is known from EP 1 933 155 A1. Various embodiments of the circuit boards or conductor plates are described. In a first embodiment, the circuit board is in the form of a disk. A second embodiment is formed by a flexible circuit board, which is disposed in the rotational direction of the bearing. The circuit board has both curved and straight sections thereby. Electronic modules are attached to the straight sections at defined spacings. The circuit board is bonded to a mount in the bearing, or held in place by a clip, for example.

An electronic module assembly is described in an earlier German patent application by the applicant under the application number 10 2015 202 129.7, which is disposed in a cylindrical installation space in a bearing. The assembly is composed of a mount, an electric line, and one or more electronic modules electrically connected to the line. It is also disclosed therein that the assembly can be adapted to the respective cylindrical installation space, such that it is not necessary to develop and install electronic components specifically created to fit within the respective diameter thereof. The content of this earlier application is expressly included in the disclosure of the present patent application, in particular in reference to the specific construction of the mount with the line and possibilities for positioning the electronic modules.

Such bearing assemblies typically only use electronic modules that function with the same system supply voltage for economical reasons. If electronic modules that require different supply voltages are used in a bearing assembly, each function module must first be supplied with the appropriate voltage by a power supply module, requiring an individual electric conductor path on the mount for each voltage, thus requiring a lot of space on the mount. The same applies for signal transmission via the conductor paths on the mount, in particular when the electronic modules comprise interface modules for converting the signals. Because the installation space in or on the mount is limited, it is not possible to accommodate an unlimited number of conductor paths on the mount, such that certain circuit configurations cannot be implemented when numerous supply voltages are required or signals are to be transmitted between individual electronic modules.

SUMMARY

The object of the present disclosure may be to create a bearing assembly with an electric line that can be adapted to various installation space sizes or mount sizes, which also allows for different voltages or signals to be supplied to the electronic modules, without requiring more space on the mount for additional conductor paths.

The object is obtained according to the disclosure by the bearing assembly according to the disclosure below.

The bearing assembly according to the disclosure comprises a bearing, which supports a machine part, and an installation space inside the bearing assembly for receiving at least one, preferably numerous, electronic modules. The bearing assembly furthermore comprises a mount located in the installation space, which has an electric line running longitudinally. There is at least one continuous electric conductor path and at least one interrupted electric conductor path with at least one interruption on the electric line, wherein the interrupted conductor path is parallel to the continuous conductor path both before and after the interruption. At least one electronic module is attached to the mount, which is in contact with one or more of the conductor paths.

The bearing may be a roller bearing. The mount and the electric line may be adapted to the diameter of the respective cylindrical installation space. The mount may be a hollow cylindrical structure, and the electric line is a flexible electric line, which is at least partially disposed in the circumferential direction of the mount in an annular shape. The electric line may be formed by numerous layers composed of films in order to obtain the flexibility.

A simple adaptation to different installation space diameters may be enabled thereby. This requires only that the mount be adapted to the respective installation space. The intrinsically valuable and complex electronic modules remain unchanged in terms of their geometry, contact points and functionality, such that they can be used in numerous product variations. A modular system can thus be created according to the disclosure that can be used in numerous applications. Mounts adapted to the typical installation spaces with different diameters can thus be provided, which can be combined as needed with similar electronic modules connected by using the electric line.

One advantage with using a flexible electric line is that this line can be easily shortened, and can thus be adapted to the respective mount and the curvature thereof dictated by its bearing.

The electronic modules are electrically, and may also be mechanically, connected to the electric line. The electronic modules may be power supply modules, function modules, protective circuitry modules and/or interface converter modules. They have at least one electric contact point on at least one side, which may be composed of an electrically conductive substance. According to an advantageous embodiment, the electronic modules with their contact points are cuboid.

The electric contact points of the electronic modules are electrically connected to electric contact points of the electric line via a connecting element made of an electrically conductive substance. The connecting element may be made of a metallic alloy (silver-tin-lead), a composite in an organic matrix (conductive adhesive), or a single metal (bonding wire).

According to an advantageous embodiment, the electric line has numerous layered, electrically conductive layers, comprising the electrical conductor paths and non-conductive layers. The layers are formed by films for practical purposes. They may have a thickness <500 μm, wherein other layer thicknesses may be used as necessary.

It has proven to be beneficial to attach the electronic modules to the electric line by using an adhesive layer. The adhesive layer on the electric line may be obtained via an appropriate adhesive.

In a particularly preferred embodiment, an input voltage corresponds to the input signal, and an output voltage corresponds to the output signal. Electronic modules for signal conversion can be power supply modules or interface converter modules, for example.

In a preferred embodiment, the electronic module is thus a power supply module, which converts an input potential at its input-side first electric contact point to a different output potential, and sends this output signal to its output-side second contact point.

In another preferred embodiment, the electronic module is an interface converter module, which converts an input signal at its input-side first electric contact point to a different output signal and sends this output signal to its output-side second contact point.

If there are numerous interruptions in the line, bridged by power supply modules, numerous different voltage potentials can be transmitted on the flexible electric line without requiring additional installation space for conductor paths with different voltages. Consequently, in principle only one conductor path, potentially having numerous interruptions, is needed on the mount, the individual sections of which conduct different supply voltages that are needed by downstream function modules. As a result, not only is there a savings in material, but space on the mount or in the installation space is also saved. It is evident that this multiple use of the space on the mount is also obtained with interrupted conductor paths that conduct a signal other than a supply voltage.

A function module is normally disposed on the electric line formed according to the power supply module, i.e. the function module is located at the output of the power supply module, and is supplied with an operating voltage accordingly. As a matter of course, the function modules can also be located in a known manner in front of the power supply module, as long as these upstream modules do not require the operating voltage generated by the power supply module.

In order to maintain the position and the corresponding spacings between the modules disposed on the mount, receiving elements may be located on the mount, which also form the mechanical interfaces. The receiving elements, or receivers, are securely connected to the mount.

If the input-side electric interfaces have the same shape in the both the power supply modules as well as the function modules, the positions of the modules on the mount with the receivers can be selected arbitrarily. This results in the advantage of numerous different configuration variations. Another advantage is that the mechanical attachment of the modules to the mount can be obtained at a certain distance to the electric interfaces, thus minimizing the risk of damage to the components.

The electronic modules may be grouped successively in the circumferential direction of the mount on the flexible electric line, such that they are aligned radially to the rotational axis, resulting in a star-shaped configuration.

One of the conductor paths of the line may be supplied with the system input voltage, which is tapped into by the function modules as needed. One advantageous embodiment uses a mount made of plastic.

The flexible electric line has at least two conductor paths according to the disclosure, specifically a continuous electric conductor path and an interrupted electric conductor path that has at least one interruption.

There is an electronic module at the location of the interruption of the conductor path, which covers this interruption mechanically. The electronic module converts an input signal at its input-side first electric contact point to a different output signal, and sends this output signal to its output-side second contact point. The first contact point is electrically connected to the interrupted conductor path before of the interruption, while the second contact point is connected to the interrupted electric conductor path after the interruption. The conductor path before the interruption and the conductor path after the interruption thus have different or separate signals as a result of the interruption of the electric conductor path and the signal conversion by the electronic module.

BRIEF DESCRIPTION OF THE DRAWINGS

Preferred embodiments of the disclosure shall be explained in greater detail below on the basis of the attached drawings. Therein.

DETAILED DESCRIPTION

Figure 1:
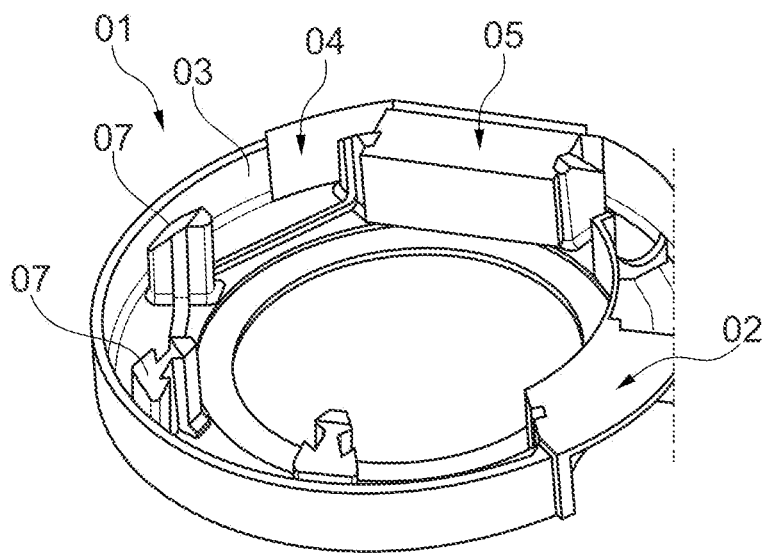
FIG. 1 shows a perspective view of a detail of a bearing assembly according to the disclosure.

FIG. 1 shows a perspective view of a part of a bearing assembly 01 according to the disclosure. The bearing assembly 01 comprises, in the known manner per se, a bearing for supporting a machine part (not shown), wherein an installation space is also provided in the bearing for receiving a hollow cylindrical mount 02. The mount 02 is adapted to the preferably cylindrical installation space in the bearing regarding its dimensions, in particular with respect to its inner and outer diameters. In the simplest case, the mount 02 completely fills the cylindrical installation space. The mount 02 is preferably made of plastic, and can be produced as a single injection molded component, for example. A preferably flexible electric line 04 is disposed on an inner wall 03 of the mount 02. The flexible electric line 04 extends in the direction of the circumference over at least a sub-section of the mount 02, preferably over the entire circumference of the mount.

Preferably cuboid electric modules 05 are furthermore accommodated in the mount 02, wherein only one electronic module 05 is shown in FIG. 1, for purposes of clarity. Embodiments with numerous electronic modules 05 are of course possible. The electronic modules are strung together and disposed at defined spacings to one another in the mount. If all of the available space in the mount must be used, the electronic modules can abut one another at their inner edges with respect to the radius of the mount. The electronic modules are, e.g., power supply modules or function modules, e.g. sensor modules, protective circuitry modules and/or interface converter modules. The mount 02 has receivers 07 designed for retaining the electronic modules 05.

The individual electronic modules 05 are connected to one another via the electric line 04, wherein a mechanical connection is also obtained, which does not have to fulfill a supporting function, however.

Figure 2:
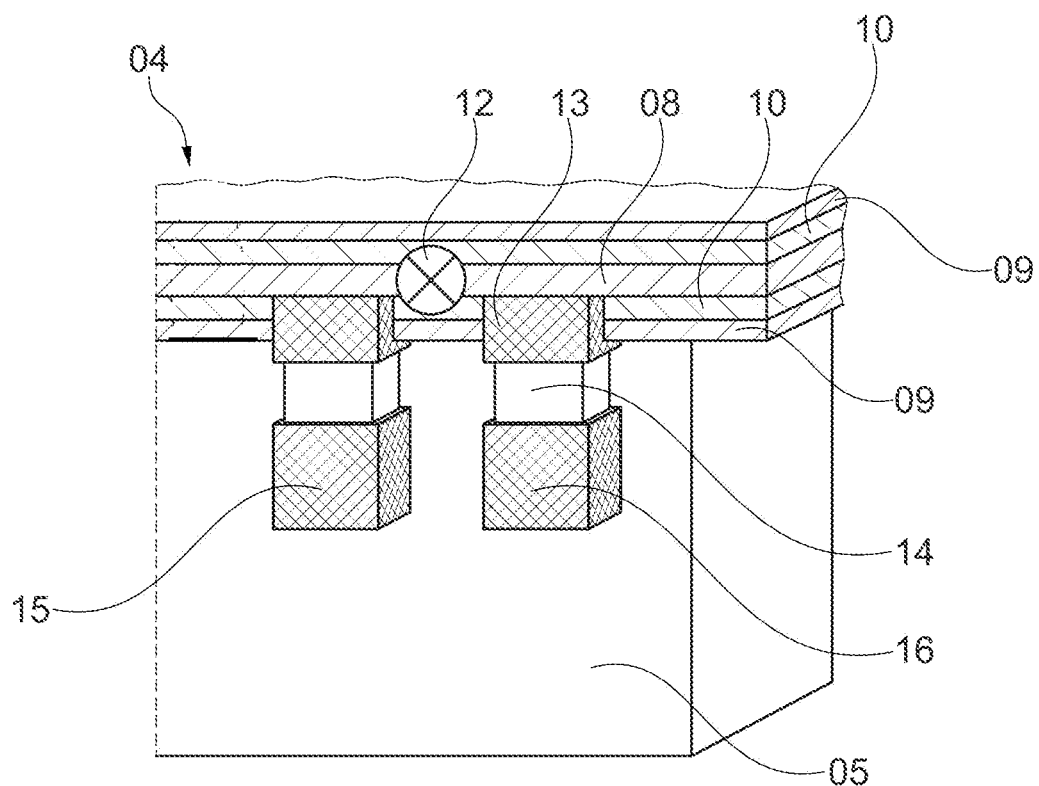
FIG. 2 shows a detailed view of an electric line in contact with an electronic module.

FIG. 2 shows in detail an illustration of the electric line 04 and the electronic module 05, as well as the contacts thereof. The flexible electric line 04 is composed of numerous layers in the depicted embodiment, the electrically conductive layers of which form electric conductor paths 08, and the non-conductive layers of which form a protective layer 09, among other things, and can comprise an adhesive layer 10. The individual layers preferably have a thickness of <500 µm. Only one electrically conductive layer is formed in FIG. 2. Embodiments with numerous layers are nevertheless possible.

The bearing assembly according to the disclosure comprises at least two electric conductor paths as components of the electric line, specifically a continuous electric conductor path and an interrupted conductor path that has at least one interruption 12. In the sectional view shown in FIG. 2, the interrupted electric conductor path 08 is illustrated with its interruption 12. Practical embodiments normally make use of numerous continuous electric conductor paths as well as at least one interrupted electric conductor path.

The electric line 04 is mechanically connected to the electronic modules 05 by its adhesive layers 10. The electric line 04 has a predefined number of electric contact points 13. The positions of the contact points 13 on the electric line 04 in the circumferential direction of the mount 02 can be varied in the production process. It is thus possible to obtain a selected spacing between the electronic modules 05 in the circumferential direction of the mount 02. In this manner, the electronic modules 05 can be positioned arbitrarily in the predefined spaces, depending on their functions.

The contact points 13 of the electric line 04 are connected to input-side electric contact points 15 and output-side electric contact points 16 of the electronic modules 05 via an electric connecting element 14. The electric connecting element 14 can be made of a metallic alloy, a composite in an organic matrix, or a single metal. The person skilled in the art will readily know that the type of contact can be adapted accordingly. By way of example, toothed, microstructured surfaces can be used.

Numerous electric contact points 15, 16 of the electronic module 05 are located on at least one side of the module. The electric contact points 15, 16 of the electronic modules 05 are preferably cuboid. In a modified embodiment, the contact points can also be disposed on the back surface of the electronic modules. Contact can be established in this case through the placement thereof on the conductor if the contact points are furnished accordingly, e.g. through bonding, ultrasonic welding, etc.

An electronic module 05 in the form of a power supply module is placed at the interruption 12 in the interrupted electric conductor path 08. This module has at least two electric contact points 15 and 16, which are connected, as described above, to the contact points 13 of the interrupted electric conductor path 08 by an electric connecting element 14. The input-side first contact point 15 of the power supply module is in contact with the contact point 13 of the electric conductor path 08 before the interruption 12. The output-side second contact point 16 of the power supply module is in contact with a further contact point 13 of the electric conductor path 08 after the interruption 12.

The contact points of the electric conductor path 08 can be located on a contact pad, which is interrupted by the interruption 12. The definition of input-side and output-side is obtained by the position of the system input. The input potential at the input is converted by the power supply module 05 to a different output potential, and output at the output-side contact point after the interruption. For this reason, the conductor path sections before and after the interruption have different electric potentials. The power supply module bridges the interruption 12 in this manner.

Although the embodiment described above uses a power supply module for the electronic module, it should be noted that other modules can also use the interruptions provided on the conductor paths for receiving an input signal at an input-side first electric contact point and sending a different output signal to an output-side contact point.

If there are numerous interruptions in the flexible electric line 04 that are bridged by power supply modules 05, numerous different voltage potentials can be generated on the electric line. As a result, no supplementary conductor paths are needed for different voltages. Consequently, in principle only an interrupted supply line is needed for the numerous different supply voltages required by different function modules. As a result, not only is there a savings in material, but also, space is saved on the electric line.

The same structure possible in an embodiment modified with other types of electronic modules, e.g. interface converter modules or protective circuitry modules. It is also possible to obtain a potential separation with a voltage that remains the same. In a modified embodiment, the interruption 12 of the electric conductor path 08 can thus accommodate a protective circuitry, e.g. as a voltage surge protection. In this case, the electric line has the same potential before and after the interruption 12, wherein the potential after the interruption is protected by the interconnected electronic module.

In order to establish the potential and the corresponding spacings between the electronic modules 05 disposed on the mount, there are receivers 07 in the intermediate spaces, which form the mechanical interfaces. The receivers 07 are permanently connected to the mount 02. Because the input-side electric interfaces are the same for both the power supply modules and the function modules, the positions of the electronic modules 05 on the mount using the receivers 07 can be selected arbitrarily. As a result, numerous different configurations can be advantageously obtained.

As a result of the design according to the disclosure for the electric line 04, no small signals need to be transmitted via the electronic module, such that disruptions of these small signals by transient currents are prevented. Furthermore, malfunctioning of individual electronic modules 05 can be better compensated for with the design according to the disclosure.

The electric line 04 can produce a connection to contact and connection terminals if there is to be a contact established with external structural elements. The contact of the connection line to the electric line 04 is the same for all configurations. This is because of the interruptions 12 in the electric conductor path 08 and the associated savings in terms of further conductor paths, because all of the voltages can be implemented with a single electric conductor path 08 and the corresponding electronic modules 05. Accordingly, pre-assembled cable assemblies can be used.

LIST OF REFERENCE SYMBOLS 01 bearing assembly
02 mount
03 inner wall of the mount
04 flexible electric line
05 electronic module
06
07 receiver
08 interrupted electric conductor path
09 protective layer
10 adhesive layer
11
12 interruption of the electric conductor path
13 electric contact points of the electric line
14 electric connecting element
15 input-side electric contact point of the electronic module
16 output-side electric contact point of the electronic module

The invention claimed is:

1. A bearing assembly comprising:
an installation space for configured to receive at least one electronic module;
a mount extending into the installation space that has an electric line comprising numerous one or more electric conductor paths running in a longitudinal direction of the mount;
wherein the at least one electronic module is in contact with one or more conductor paths, wherein the electric line comprises at least one continuous electric conductor path and at least one interrupted electric conductor path that has at least one interruption, wherein the interrupted conductor path runs parallel to the continuous conductor path before and after the interruption, and in that at least one electronic module is connected to the interrupted conductor path before the interruption and is connected to the interrupted conductor path after the interruption with a second contact point, wherein the electronic module is configured to receive an input signal using a first contact point, converts this signal to an output signal, and outputs the output signal to the second contact point.

2. The bearing assembly of claim 1, wherein the electric line comprises numerous continuous conductor paths and numerous interrupted conductor paths.

3. The bearing assembly of claim 2, where the electronic module is a power supply module, a function module, protective circuitry module, and/or an interface converter module.

4. The bearing assembly of claim 3, wherein the electronic module is attached to the mount with receivers.

5. The bearing assembly of claim 4, wherein the first and second contact points of the electronic module are disposed on one side of the electronic module.

6. The bearing assembly of claim 5, wherein the electric line is a flexible electric line that can be adapted to a curvature of the mount.

7. The bearing assembly of claim 6, wherein the flexible electric is adapted to the number of electronic modules.

8. The bearing assembly of claim 7, wherein a connecting line establishes a direct contact to the flexible electric line.

9. The bearing assembly of claim 8, wherein a supply voltage on a section of the interrupted conductor path before the interruption is converted to a different supply voltage that is supplied by the electronic module to a section of the interrupted conductor path after the interruption.

10. The bearing assembly of claim 8, wherein a first signal on a section of the interrupted conductor path before the interruption is converted by the electronic module to a second signal, which is supplied by the electronic module to a section of the interrupted conductor path after the interruption.

11. A bearing assembly, comprising:
an installation space configured to receive at least one electronic module;
a mount in the installation space that includes an electric line and the electronic module is attached to the mount;
one or more continuous electronic conductor paths;
one or more interrupted conductor path that is parallel to the continuous electronic conduct path.

12. The bearing assembly of claim 11, wherein the electronic module is in contact with one or more of the continuous electronic conductor paths.

13. The bearing assembly of claim 11, wherein the electronic module is in contact with one or more of the interrupted conductor paths.

14. The bearing assembly of claim 13, wherein the electronic module is also in contact with one or more of the continuous electronic conductor paths.

15. The bearing assembly of claim 11, wherein the mount 1s configured to adapt to a diameter of the installation space.

16. The bearing assembly of claim 11, wherein at least one electronic module includes at least one electric contact point on at least one side of the at least one electronic module, wherein the at least one electric contact point is connected to the electric line via a conductive element.

17. The bearing assembly of claim 11, wherein the electronic module is an interface converter module.

18. The bearing assembly of claim 11, wherein the electronic module is an interface converter module.

19. The bearing assembly of claim 18, wherein the interface converter module is configured to convert an input signal at an input-side first electric contact point to a different output signal and send the output signal to an output-side second contact point.

20. A bearing assembly comprising:
an installation space configured to receive at least one electronic module; and
a mount extending into the installation space that includes an electric line that has one or more electric conductor paths running in a longitudinal direction of the mount and the at least one electronic module is in contact with one or more conductor paths;

at least one continuous electric conductor path; and at least one interrupted electric conductor path including at least one interruption, wherein the interrupted conductor path runs parallel to the continuous conductor path before and after the interruption, and in that at least one electronic module is connected to the interrupted conductor path before the interruption and is connected to the interrupted conductor path after the interruption with a second contact point.

\* \* \* \* \*